United States Patent
Yao

(10) Patent No.: US 10,612,956 B2
(45) Date of Patent: Apr. 7, 2020

(54) USING FLAMELESS COMBUSTION OF FUEL GAS TO GENERATE POWER FOR A GAS METER

(71) Applicant: Natural Gas Solutions North America, LLC, Houston, TX (US)

(72) Inventor: Richard Jin Yao, The Woodlands, TX (US)

(73) Assignee: Natural Gas Solutions North America, LLC, Houston, TX (US)

( * ) Notice: Subject to any disclaimer, the term of this patent is extended or adjusted under 35 U.S.C. 154(b) by 193 days.

(21) Appl. No.: 15/796,111

(22) Filed: Oct. 27, 2017

(65) Prior Publication Data

US 2019/0128721 A1    May 2, 2019

(51) Int. Cl.
| | |
|---|---|
| F23N 5/00 | (2006.01) |
| F23N 5/18 | (2006.01) |
| G01F 15/04 | (2006.01) |
| G01F 15/00 | (2006.01) |
| H01L 35/32 | (2006.01) |

(Continued)

(52) U.S. Cl.
CPC ............ *G01F 15/005* (2013.01); *F23C 99/00* (2013.01); *F23N 5/003* (2013.01); *F23N 5/188* (2013.01); *G01F 1/05* (2013.01); *G01F 15/04* (2013.01); *H01L 35/32* (2013.01); *F23C 2900/03001* (2013.01); *F23C 2900/99001* (2013.01);
(Continued)

(58) Field of Classification Search
CPC .......... G01F 15/005; G01F 15/04; G01F 1/56; G01F 15/002; G01F 1/05; H01L 35/32; H01L 35/00; F23N 5/003; F23N 5/188; F23N 2025/08; F23N 2041/08; F23N 2900/01001; F23C 2900/03001; F23C 99/00; F23C 2900/99001; F23C 13/00; F23M 20/00; F23M 2900/13003; Y02T 10/166; H02N 2/186; G05D 16/063; G05D 16/0655; H02J 7/0052
See application file for complete search history.

(56) References Cited

U.S. PATENT DOCUMENTS 3,691,408 A  * 9/1972 Rosso ................. H01L 35/30
                                                    310/306
4,118,193 A  * 10/1978 Neti ..................... G01N 31/10
                                                    422/54

(Continued)

FOREIGN PATENT DOCUMENTS

| EP | 3348971 A1 | 7/2018 |
| WO | 0210695 A1 | 2/2002 |
| WO | WO 2004004863 A1 | 1/2004 |

OTHER PUBLICATIONS

Rattanongphisat et al., "Improvement Vortex Cooling Capacity by Reducing Hot Tube Surface Temperature: Experiment," 2014, pp. 1-9, vol. 52, AEDCEEE.

(Continued)

*Primary Examiner* — Brandi N Hopkins
(74) *Attorney, Agent, or Firm* — Paul Frank + Collins P.C.

(57) ABSTRACT

A power generator for use to generate power for metrology hardware like gas meters and flow measuring devices. The power generator may use flame-less combustion that creates heat from fuel gas. The heat causes a temperature differential. The power generator may include a thermal electric generator that generates an electrical signal in response to the temperature differential.

20 Claims, 11 Drawing Sheets

(51) Int. Cl.
  *G01F 1/05* (2006.01)
  *F23C 99/00* (2006.01)
(52) U.S. Cl.
  CPC ...... *F23N 2025/08* (2013.01); *F23N 2041/08* (2013.01); *F23N 2900/01001* (2013.01)

(56) References Cited

U.S. PATENT DOCUMENTS

| | | | |
|---|---|---|---|
| 8,134,066 B2 | 3/2012 | Shkolnikov et al. | |
| 8,829,326 B2 | 9/2014 | Dell et al. | |
| 9,083,020 B2* | 7/2015 | Scotto | H01M 8/04268 |
| 2003/0167919 A1* | 9/2003 | Schempf | F17D 3/01 |
| | | | 95/15 |
| 2006/0260186 A1* | 11/2006 | Iversen | C10G 1/08 |
| | | | 44/605 |
| 2008/0029624 A1* | 2/2008 | Shkolnikov | B05B 5/10 |
| | | | 239/690 |
| 2012/0000281 A1* | 1/2012 | Vo | G01F 3/06 |
| | | | 73/272 R |
| 2015/0102603 A1 | 4/2015 | Schaefer et al. | |

OTHER PUBLICATIONS

Schaevitz et al., "A Combustion-Based MEMS Thermoelectric Power Generator," 2001, Obermeier E. Transducers '01, Eurosensors XV.

Norton et al., Portalbe Power Generation Via Integrated Catalytics Microcombustion-Thermoelectric Devices, 2006, Proceedings of the 24th Army Science Conference.

Hsu et al., Minature Power Source with Catalytic Combustor and Hybrid Thermoelectric Generator, 2012, PowerMEMS 2012, Atlanta, GA.

Extended European Search Report (EESR) dated Jun. 6, 2019, in corresponding EP18201845.7.

* cited by examiner

USING FLAMELESS COMBUSTION OF FUEL GAS TO GENERATE POWER FOR A GAS METER

BACKGROUND

Metrology hardware finds use across a wide range of applications. For example, the fuel gas industry uses flow meters or "gas meters" to measure consumption, bill customers, and manage inventory of fuel gas. These devices may include additional functionality devices (AFDs) to expand functions of the gas meter, such as for remote communications, data storage, or data exchange. Operation of the AFDs, however, typically requires a stored energy source, like a battery, that provides power adequate to energize electronics.

SUMMARY

The subject matter of this disclosure provides power to metrology hardware. Of particular interest are power generators that can generate power from combustible materials like fuel gas. But any device on or in vicinity to a source of combustible fuel, like gas lines or pipe lines, may benefit from the concepts discussed herein. These embodiment may outfit gas meters to generate an electrical signal that can power electronics on the gas meter, or replace, supplement, or charge the stored energy source that supports the AFD electronics necessary to expand functions on the device.

Some embodiments address certain drawbacks one might associate with the on-board power source or supply. In situ power from the embodiments can re-charge or reduce duty cycle on batteries or battery packs, which may preclude maintenance necessary to check and replace them in the field. This feature may save significant costs of labor because, for example, gas meters may number in the hundreds and thousands in the field and, moreover, often reside in remote areas, both of which may present major logistical challenges that require careful planning. Use of the embodiments may also improve reliability in the event that batteries malfunction (e.g., lose charge) unexpectedly or suffer reduction or total loss of energy prematurely, which is a significant nuisance and unplanned expense for the operator.

Some embodiments may also address future power needs for gas meters and related metrology hardware. For gas meters, in situ power generation may meet future data transmission demands that would otherwise exceed on-board batteries by, for example, drawing an unreasonable amount of power from an on-board battery or energy storage unit. In situ power generation can also allow gas meters to expand functionality, for example, in the form of new electronics and sensors including transmitting devices to communicate with a Supervisory Control and Data Acquisition (SCADA) system, cloud-connected product life-cycle management software, remote reading (e.g., smart meters), and the like. In use, duty cycle for transmitting data may be periodic, which would elevate power demand for brief periods of time. More demanding scenarios might require real-time data transmission to monitor ongoing device health or diagnostics in a connected system, which may require almost-continuous supply of reliable power on the device.

DRAWINGS

Reference is now made briefly to the accompanying figures, in which.

Figure 1:
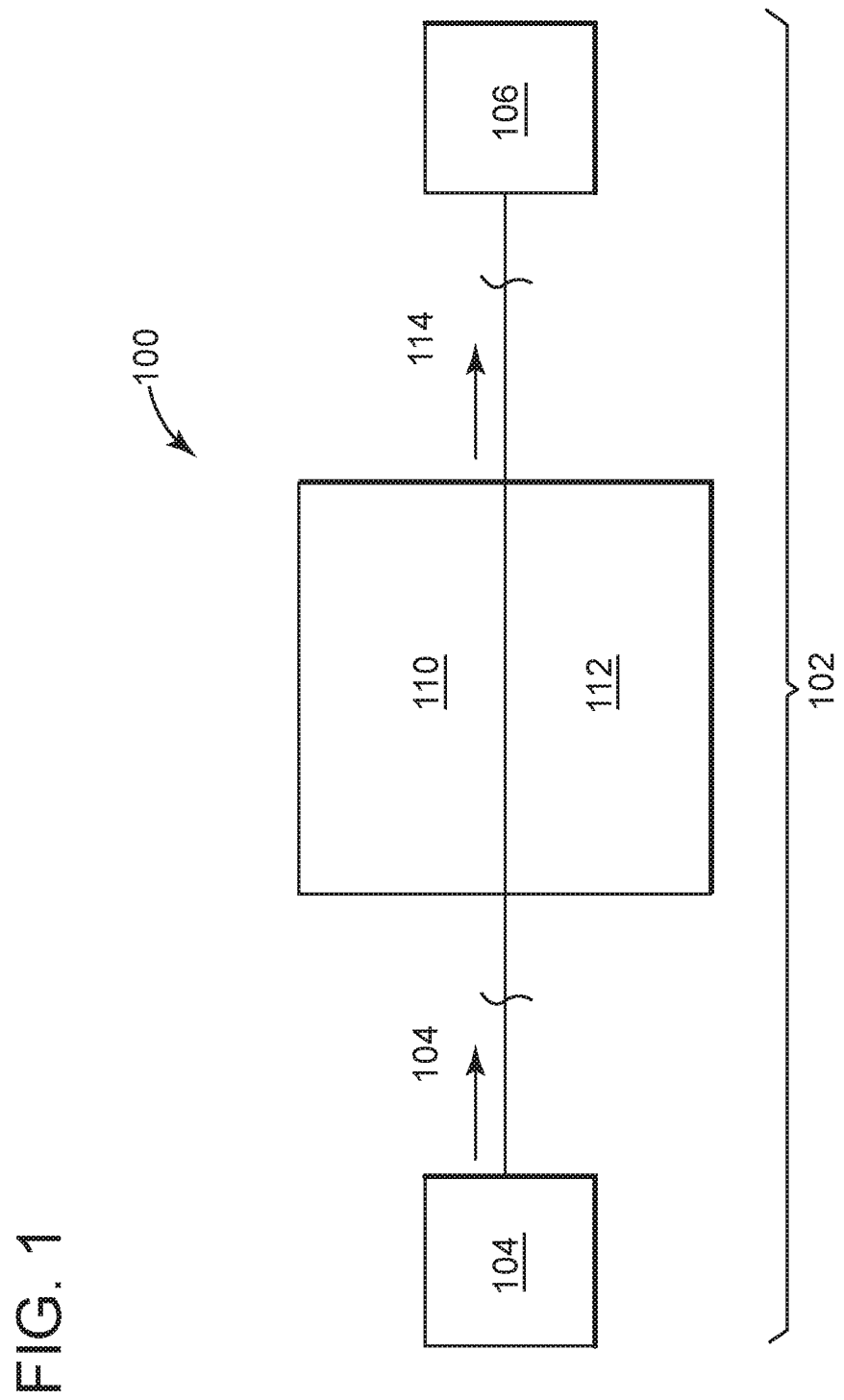
FIG. 1 depicts a schematic diagram of an exemplary embodiment of a power generator.

Where applicable like reference characters designate identical or corresponding components and units throughout the several views, which are not to scale unless otherwise indicated. The embodiments disclosed herein may include elements that appear in one or more of the several views or in combinations of the several views. Moreover, methods are exemplary only and may be modified by, for example, reordering, adding, removing, and/or altering the individual stages.

DETAILED DESCRIPTION

The discussion that follows describes embodiments of a power generator that combusts fuel to generate power. The embodiments may install onto metrology hardware, like gas meters, to power electronics and other additional functionality devices (AFDs). This feature, in turn, enables new or enhanced functionality that would otherwise not be available because of power limitations that predominate on devices of this type. Other embodiments are within the scope of the subject matter herein.

FIG. 1 illustrates a schematic diagram of an exemplary embodiment of a power generator 100. This embodiment is shown as part of a system 102 having a fuel source 104 and load 106. The fuel source 104 may deliver fuel 108, typically a gas or liquid that is flammable or combustible like fuel gas. For purposes of this discussion, the load 106 may embody metrology hardware (like a gas meter), electrical components on metrology hardware, energy storage media (e.g., batteries, power cells, etc.), or additional functionality devices (AFDs). But other applications may prevail, particularly, where the power generator 100 has access to the combustible fuel 108. As also shown, the power generator 100 may include a combustion unit 110 and a power unit 112. The units 110, 112 outfit the power generator 100 to use the fuel gas 108 to generate a signal 114, like an electrical signal (e.g., current or voltage).

Broadly, the power generator 100 is configured to leverage fuel gas 108 that predominates at locations proximate gas meter 106 and related metrology hardware. These configurations uses "flameless" power generating techniques to improve on practices to date that, typically, rely exclusively on batteries with longevity of several years. Power systems, like solar or wind, may be useful as well. But these systems may require collateral hardware that adds significant cost and is not particularly well-suited to install at local commercial and residential. As discussed below, the "flameless" design avoids open flames in proximity to the combustible fuel. This feature allows the device to integrate into gas meters, but allow the gas meters to still comply with safety standards or regulations. At the same time, the gas meter can generate power, in situ, with a localized feedstock (e.g., the flowing fuel gas) to support existing electronics or AFDs that expand functionality.

Gas meter 106 may be configured to measure or "meter" flow of fuel gas 108. These configurations often operate as mechanical, positive-displacement devices. Rotary-types of these devices may include an impeller or turbine that rotates in response to flow of fuel gas 106. Other types have a diaphragm or bellows that translates in response to the flow. A collateral device or "index unit" may be used to monitor movement of the impeller or diaphragm to quantify the amount of gas. This index unit often has electronic components that are necessary to process signals. These components may also include a display to visualize data (on a screen). Keypads may provide access for an end user (e.g., a technician) to manipulate operation of the device.

The combustion unit 110 may be configured to combust the fuel gas 108. Proximity to the source 104 or inclusion into the metrology hardware 106, however, likely requires the device to operate without a flame in the stream of combustible fuel (or fuel mixture). Plus it may benefit to have the device in a compact package or design to fit within the index unit (or otherwise secure or attach to the metrology hardware 106).

The power unit 112 can be configured to generate the power signal 114 in response to a temperature differential. These configurations may include thermoelectric generator and like solid state devices that convert heat flux into electrical energy. Suitable devices may employ thermoelectric materials that produce the electrical energy in accordance with the Seebeck effect. Selection of these materials may match Seebeck coefficients with temperature of combustion at the combustion unit 110.

Figure 2:
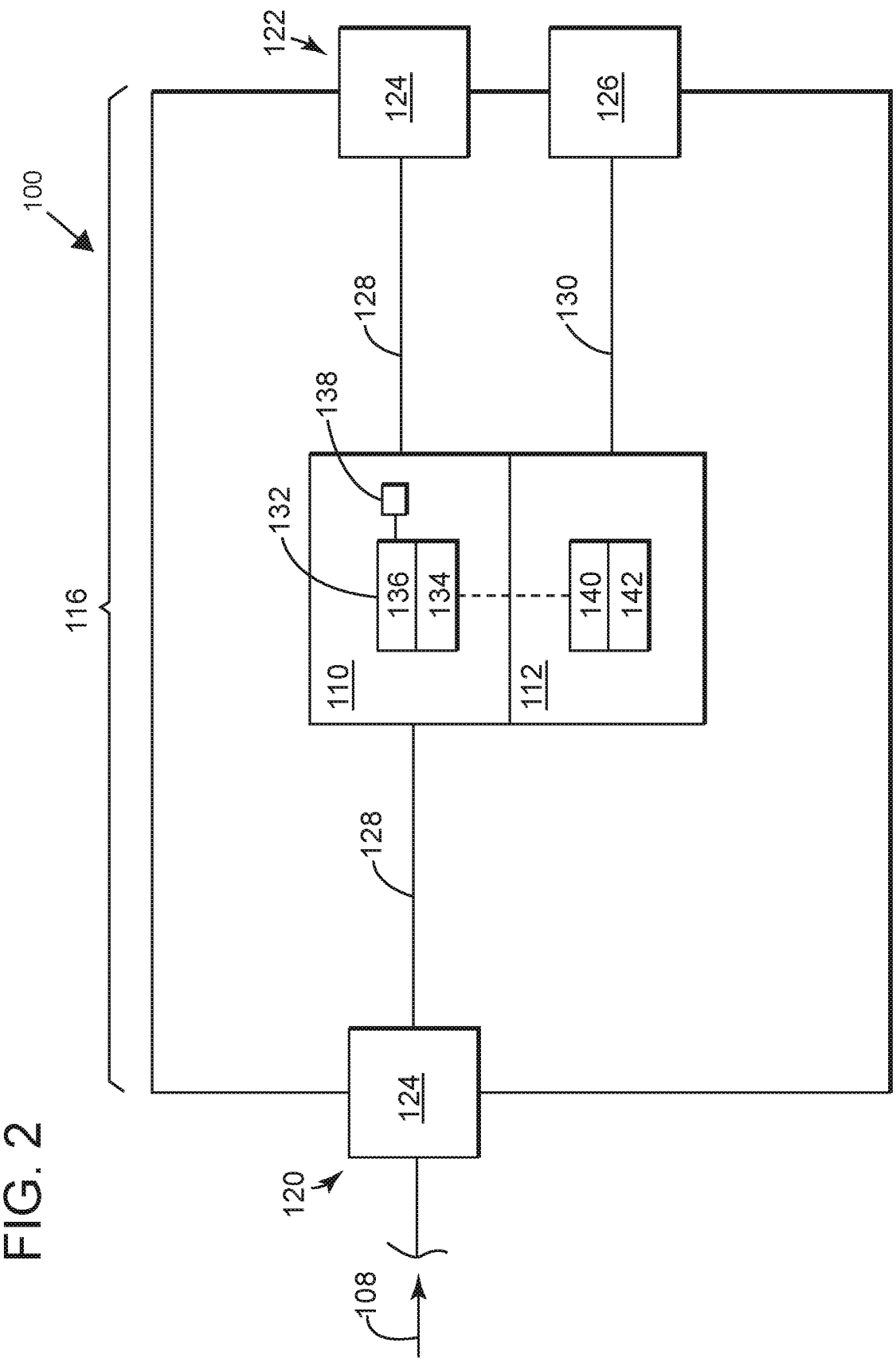
FIG. 2 depicts a schematic diagram of an example of the power generator of FIG. 1.

FIG. 2 depicts a schematic diagram of an example of the power generator 100 that is safe to use in proximity to fuel pipelines. In this example, the power generator 100 may include a device package 116 with a housing 118 having openings (e.g., a first opening 120 and a second opening 122). The openings 120, 122 may operate as an "inlet port" and "an exhaust port," respectively. Pipe or tube fittings 124 may reside at the ports 120, 122. Examples of the fittings 124 may couple the device package 116 with tubes or pipes that carry fuel 108. The device package 116 may also include an electrical connector 126 to couple with the load 106. Inside of the housing 118, the device package 116 may include plumbing 128 and wiring 130. The combustion unit 110 may include a flameless combustor 132, possibly a device that incorporates a catalytic reactor 134 and a starter 136. A battery 138 may connect to the starter 136 for purposes of initial ignition, as desired. In one implementation, the power unit 112 may embody a thermal electric generator 140 ("TEG 140"). The TEG 140 may couple with the reactor 134 on one side and with a heat sink 142 on the other side.

The device package 116 may be configured with parts necessary to operate the units 110, 112 to generate the signal 114. These configurations may size to meet power requirements, as necessary. Some configurations scale to comport with components that result from semiconductor or microelectromechanical (MEMs) manufacturing and packaging methods for this purpose. These techniques may form small, robust devices that can fit into, on, or in proximity to existing gas meters and like flow devices. However, this disclosure contemplates other configurations that scale for larger devices, often that result from conventional manufacturing, e.g., machining methods.

The housing 118 may be configured to enclose the parts of the device package 116. These configurations may be metal or plastic, although preference may be given to materials that meet safety requirements for use in proximity to the fuel source 104. Form factors for the housing 118 can also vary. Structures that fully enclose the parts may find use to protect sensitive components as well as to retain heat or thermal energy inside. In some cases, the housing 118 may include structure to secure the components inside, including, brackets, potting material, insulation, and other structurally resilient constructs consistent with semiconductor or MEMs-based construction or with conventionally-sized components as well.

Elements 128, 130 may facilitate "transport" of fluids and electricity through-out the device package 116. Plumbing 128 may include tubing or conduit that is safe for use with combustible material. These components can direct fuel gas 108 throughout the device, for example, to the combustion unit 110. These components may also direct exhaust from the combustion unit 110 to the exhaust port 122, which may vent to atmosphere or appropriate filtering media, as necessary. Wiring 130 may embody conductors (e.g., wires, cables, etc.) that couple the power unit 112 to the electrical connector 126. These conductors allow the signal 114 to transit from the package 116 to devices that connect to the electrical connector 126.

The flameless combustor 132 is configured to operate on the fuel gas 108 to generate heat. These configurations may, generally, use flame-less techniques to satisfy safety requirements to use the power generator 100 in proximity to the fuel source 104, for example, near pipelines, mainlines, and other flow-through elements that carry combustible fuel 108. This device may leverage catalytic micro-combustion at the catalytic reactor 134 for this purpose. Combustors of this type utilize the high energy densities of the fuel gas at low operating temperatures. This operation may be a much safer alternative to "open" flame combustion, particularly when used proximate the fuel gas lines. Exemplary catalysts for the catalytic reactor 144 may include platinum and like materials that can cause appropriate combustion reactions with hydrocarbons (e.g., fuel gas). The starter 136 may initiate reaction when necessary. For example, use of the starter 136 may generate heat (or, generally, thermal energy) that is sufficient to initiate appropriate catalytic reactions in the reactor 134.

The TEG 140 may be configured to utilize temperature differential due to heat from the catalytic reactor 134 to generate the signal 114. These configurations may abut or be in close proximity to the catalytic reactor 134. Such placement may maximize heat transfer to the TEG 140. The heat sink 142 may locate on a side opposing the catalytic reactor 134. This device may embody a "block" made of metal or other material that can assume a temperature that is lower than the "heated" side of the TEG 148, effectively creating the temperature differential to drive the TEG 140.

Figure 3:
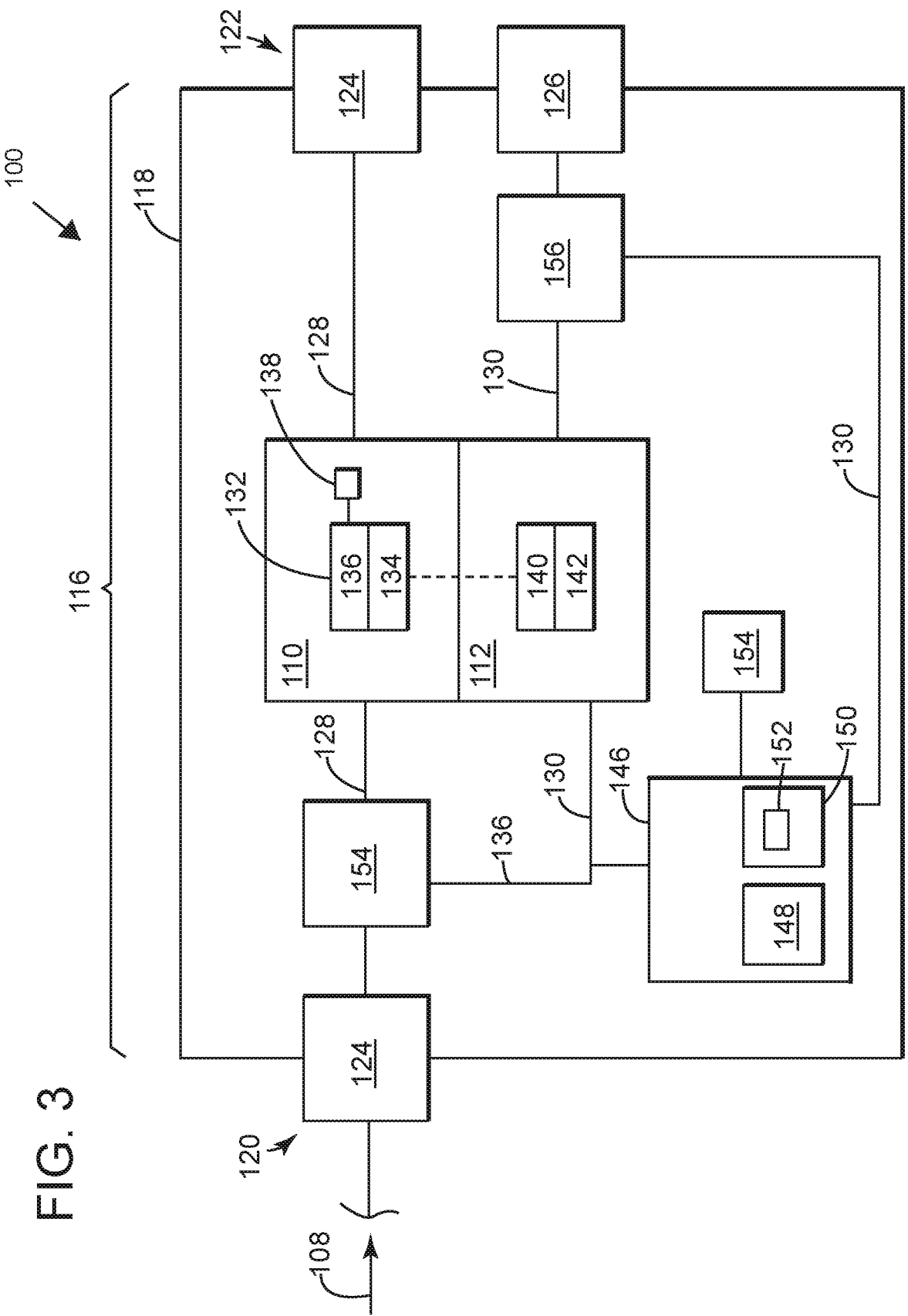
FIG. 3 depicts the power generator of FIG. 2.

FIG. 3 depicts the power generator 100 of FIG. 2 with additional control structure to manage the catalytic reaction and other functions on the device. This control structure may include a valve 144 that couples with plumbing 128 downstream of the inlet port 120 and upstream of the catalytic reactor 134. The control structure may also include circuitry in the form of a controller 146 (with a processor 148 coupled to memory 150 having executable instruction 152 stored thereon). These components may integrate together to form a micro-controller. One or more sensors 154 may be useful as well. The sensors 154 may be sensitive to temperature, pressure, humidity, and like conditions that can define or describe operation of the power generator 100. As also shown, the circuitry may include driver circuitry 156 that interposes between the TEG 140 and the electrical connector 126. Exemplary topology for the driver circuitry 156 may condition the signal 114 from the TEG 140 to conform to the load 106. This topology may include a substrate (e.g., printed circuit board) that serves to connect a combination of discrete components (e.g., rectifiers, inverters, amplifiers, etc.). The driver circuitry 156 may be disposed in the housing 118. However, the driver circuitry 156 might also form a unit that is separate from the power generator 100.

Figure 4:
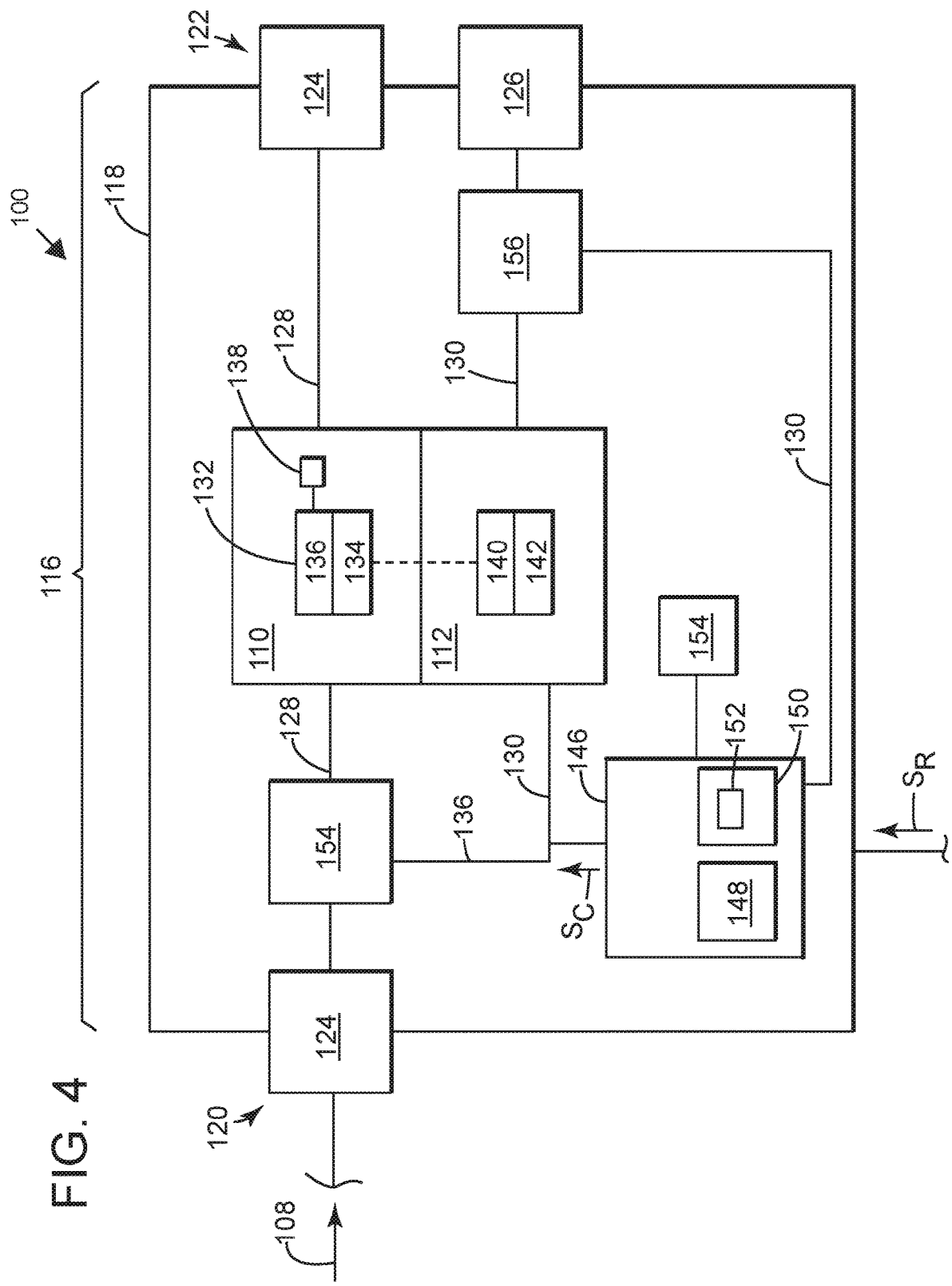
FIG. 4 depicts the power generator of FIG. 3.

FIG. 4 depicts the power generator 100 of FIG. 3 with signals to inform the following discussion for exemplary operation of the device. These signals may include a parameter signal $S_P$, a control signal $S_C$, and a remote signal $S_R$. Formats for these signals may be digital or analog, often depending on topology of any underlying circuitry noted herein. In one implementation, the executable instructions 152 may configure the controller 146 with functionality to receive and process the parameter signal $S_P$. This signal may reflect operating conditions on the power generator 100, for example, temperature (or variant thereof) inside of the housing 118 or at the catalytic reactor 134. Other functionality for the controller 146 may, in turn, generate the control signal $S_C$ to instruct the valve 144 to change state (e.g., between an open state and a closed state). These states may be effective to regulate flow of fuel gas 108 to the catalytic reactor 134 in response to temperature above a threshold level. In one implementation, the controller 146 may receive the remote signal $S_R$ from outside of the device. Additional functionality for the controller 146 may process the remote signal $S_R$ to generate the control signal $S_C$, for example, to operate the units 110, 112, the valve 144, the driver circuitry 156, or some other electrically-connected component on the power generator 100.

Figure 5:
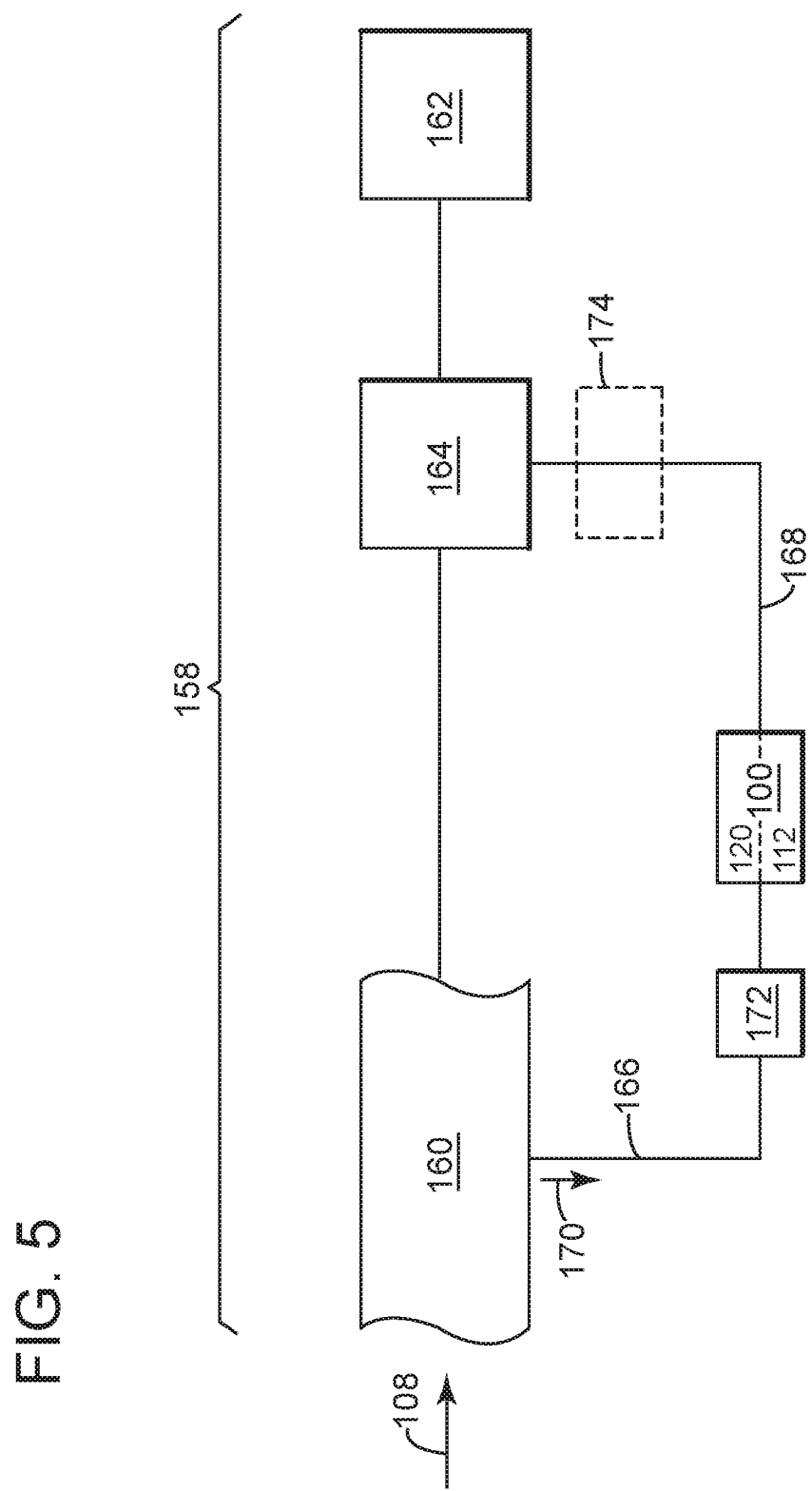
FIG. 5 depicts a schematic diagram of a first configuration for the power generator of FIG. 1.
Figure 6:
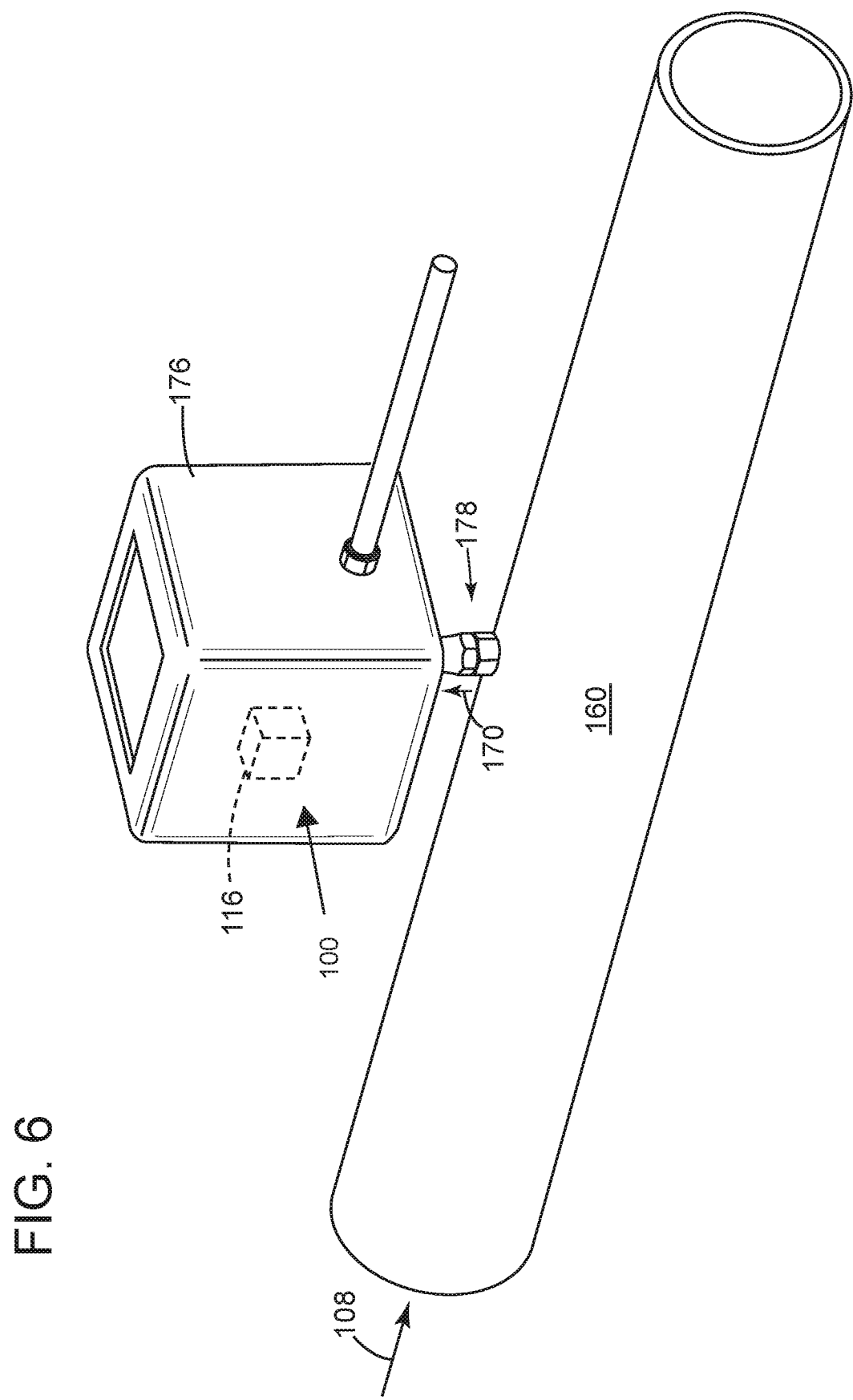
FIG. 6 depicts a perspective view of exemplary structure for the power generator of FIG. 5.
Figure 7:
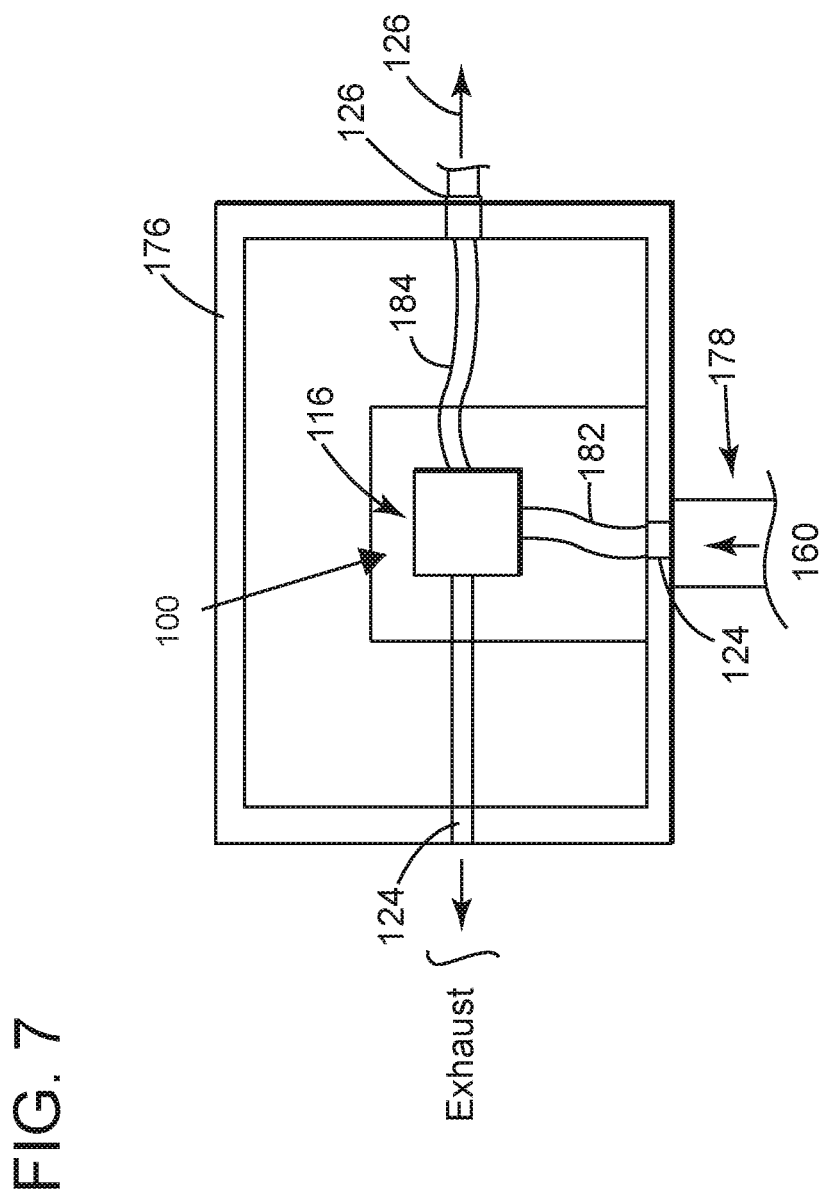
FIG. 7 depicts an elevation view of the cross-section of the structure of FIG. 6.
Figure 8:
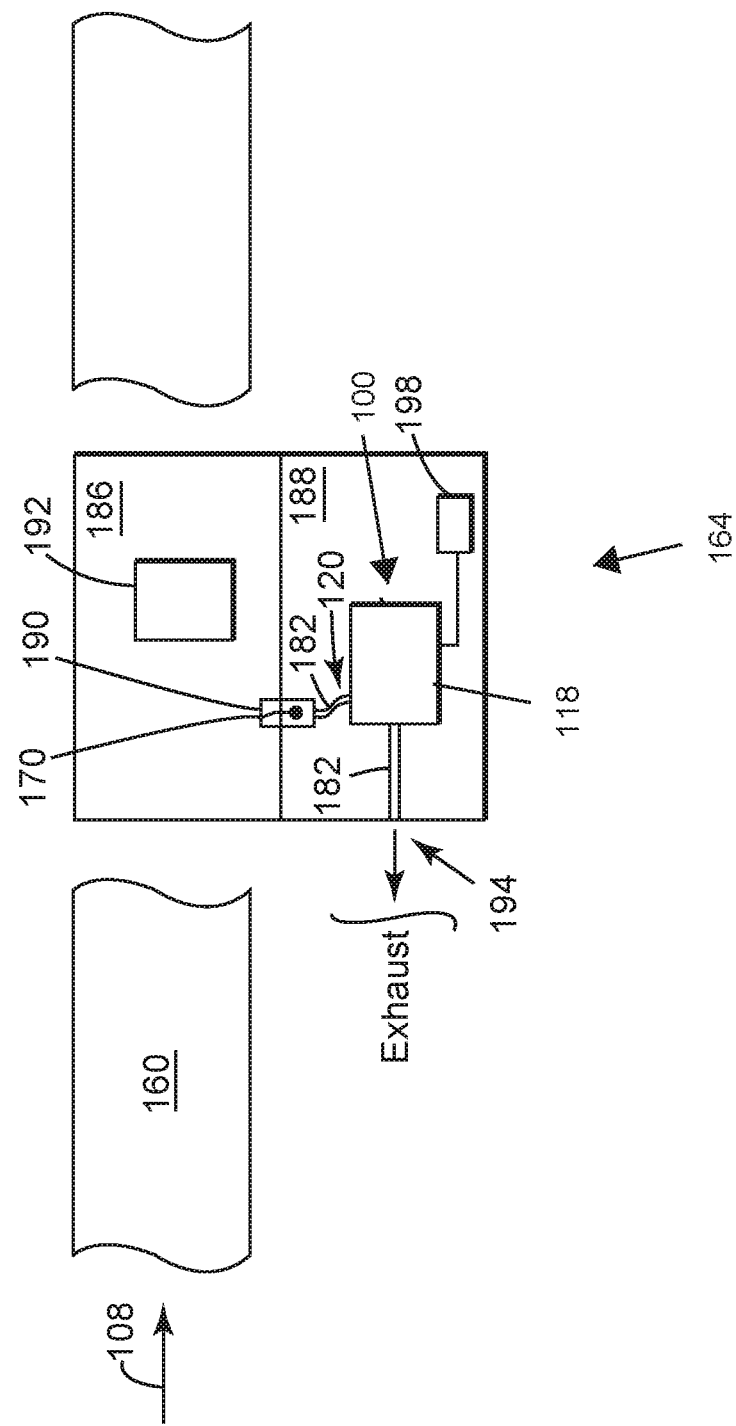
FIG. 8 depicts a schematic diagram of a second configuration for the power generator of FIG. 1.
Figure 9:
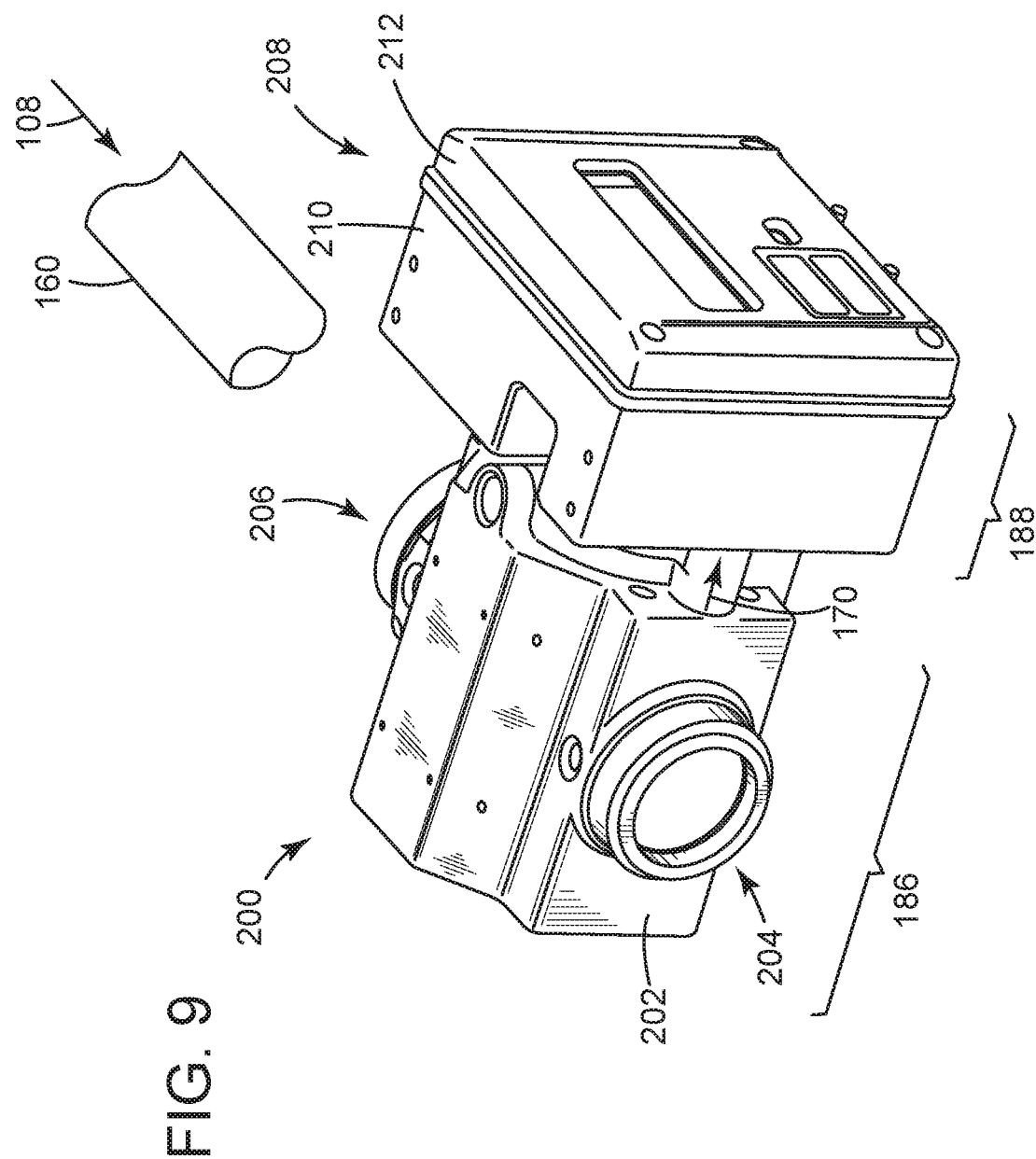
FIG. 9 depicts a perspective view of exemplary structure for a flow device in assembled form that incorporates the power generator of FIG. 8.
Figure 10:
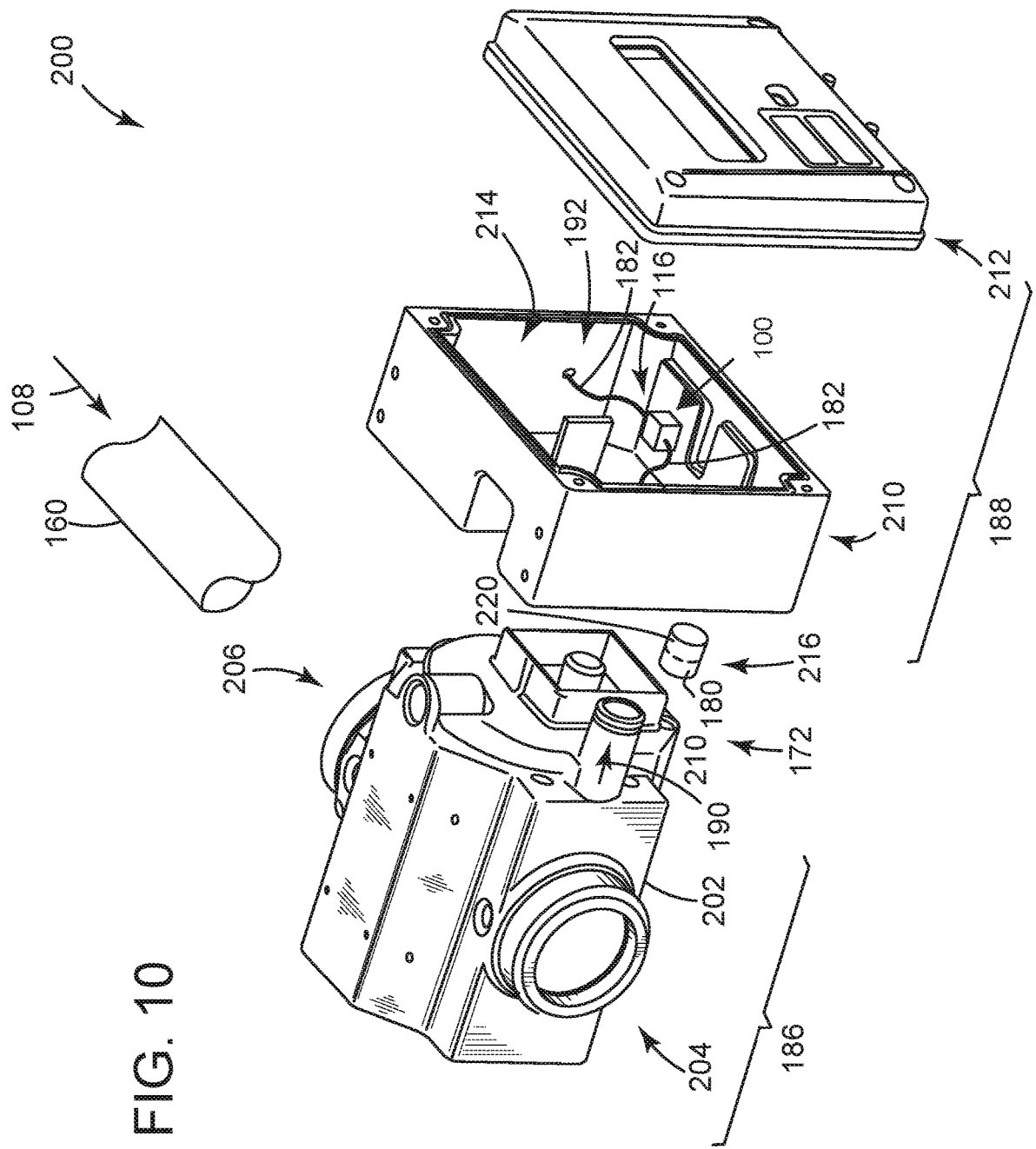
FIG. 10 depicts the flow device of FIG. 8 in partially-exploded form.

The discussion now turns to describe exemplary structures and constructions for use in connection with the power-generating concepts herein. FIGS. 5, 6, and 7 feature a configuration for the power generator 100 that may stand separate or independent from the load 106 (FIG. 1), coupling directly to the fuel source 104 (FIG. 1) or via some necessary flow or pressure regulating device. This configuration may supply power to one or more devices, like, gas meters or AFDs, as desired. FIGS. 8, 9, and 10 focus on a configuration that resides as part of or integral to structure of the load 106 (FIG. 1). Generally, this structure may embody flow meters of various types, pressure regulators, valves, actuators, and the like.

FIG. 5 depicts, schematically, a configuration for the power generator 100 that leverages flame-less techniques to generate power. This embodiment is shown as part of a distribution network, identified generally by the numeral 158. The distribution network 158 may include a conduit 160 that carries fuel gas 108. The conduit 160 may embody a high-pressure gas line from a well-head, or distribution lines and branches that carry fuel gas 108 to a customer 162. A flow device 164, like a gas meter, may couple with the conduit 160 upstream of the customer 162 to measure volumetric flow of fuel gas 108. In one implementation, the power generator 100 may couple with the network 158 by way of one or more connections (e.g., a first connection 166 and a second connection 168). The first connection 166 couples the device package 116 with the conduit 160. This configuration is useful to divert a portion 170 (also "sample 170") of fuel gas 108 for use at the combustion unit 110. As noted above, tubing or piping may suffice for this purpose. A flow regulator 172 may interpose between the power generator 100 and the conduit 114 (e.g., upstream of power generator 100 and downstream of the conduit 114). This device may be needed to regulate parameters (e.g. pressure) of the sample 170 to meet specifications for the power generator 100. The second connection 168 may include conductive wires or cables that connect the device package 116 to the gas meter 164 or with supplemental storage 174, like a battery that itself connects to discharge power to the gas meter 164.

FIG. 6 depicts a perspective view of exemplary structure for the power generator 100 in this "standalone" configuration of FIG. 5. Here, the device package 116 may reside inside a robust enclosure 176, possibly a box with a peripheral wall made of metal or like flame-resistant materials. This peripheral wall may form an interior cavity that serves to enclose and protect the components of the device package 116. The enclosure 176 may couple with the conduit 160 via a tap 178. Examples of the tap 178 may include threaded connectors that are, preferably, for use with fluids like fuel gas. Suitable connectors can affix to the conduit 160 at a pre-drilled aperture or hole so as to direct the sample 170 of fuel gas 108 into the enclosure 176.

FIG. 7 depicts an elevation view of the cross-section of the enclosure 176 of FIG. 6. The device package 116 may mount onto a bracket 180 disposed and likely affixed in the interior cavity of the protective box. Tubing 182 may couple with the tap 178 and with the fitting 124 that integrates into the housing 118 of the device package 116. This feature delivers the sample 170 for combustion to occur at the catalytic reactor 134 (FIG. 2). Tubing 182 may also couple the exhaust port 122 on the housing 118 to a similarly-situated opening on the peripheral wall of the enclosure 176. Likewise, electrical wiring 184 may connect with the electrical connector 126, itself connected to cabling 168 to allow the electrical signal 114 to transit out of the protective box.

FIG. 8 depicts, schematically, a second configuration for the power generator 100. The gas meter 164 may include a pair of metrology units (e.g., a meter unit 186 and an index unit 188). A flow connection 190 may be used to direct the sample 170 into the index unit 188. The meter unit 186 may be configured to couple in-line with the conduit 160 to receive a "main" supply or stream of fuel gas 108 that would nominally satisfy demand at the customer 108 (FIG. 1). This configuration may include a measurement device 192, which may comprise one or more devices, mechanical or electronic, that can quantify parameters of flow of material 108 in the conduit 160. As shown, the device package 100 may reside in the index unit 188. Tubing 182 may allow the sample 170 to transit to the input port 120 on the housing 118, as well as to allow exhaust egress from an aperture 194 in the index unit 188. Notably, the load 106 may embody a component 196 of the index unit, for example, a battery, AFDs, or other power-reliant device.

FIG. 9 depicts a perspective view of exemplary structure 200 for the gas meter 164 of FIG. 8 in assembled form with built in power generator 100. The meter unit 186 may have a meter body 202 with openings (e.g., a first opening 204 and a second opening 206). As noted above, the meter body 202 is configured to connect in-line with conduit 160. Flanges or like connectors may form at openings 202, 204 to facilitate connection with the conduit 104, for example, using fasteners like bolts to form a secure, leak-tight fit. Inside, the meter body 202 may be hollow to house devices, mechanical or electronic, that can respond to flow of, for example, incoming fuel gas that passes between openings 204, 206. These devices may embody impellers, diaphragms, rotary elements (e.g., turbines), sensor, hotwires, ultrasonic, and optical elements (e.g., lasers), to name a few. The index unit 188 may have an index housing 208, often having multiple parts (e.g., a first part 210 and a second part 212) that are separable to allow access to its hollow or open interior cavity 214. Inside, the index housing 208 may enclose various components, both mechanical, electrical, and electronics that are useful to render values for the measured parameters in response to inputs from the meter unit 188.

FIG. 10 depicts the structure of FIG. 9 in partially-exploded form to show the interior of the index housing 208. As shown, the device package 116 may reside in the interior cavity 214 to outfit the device 164 for in situ power generation. Other components like batteries, sensors, and circuitry may also reside in the interior cavity 214, but are not shown here for clarity. The flow connection 190 may embody or integrate as part of a fitting 216 that facilitates flow of sample 170 into the interior cavity 214. The fitting 216 may be configured to conduct both fluids (e.g., sample 170) and electrical signals, as desired. Flexible or rigid tubing may be necessary for this purpose. In more complex designs, the fitting 216 may include a pair of connectors (e.g., a first connector 218 and a second connector 220), one each disposed on the meter body 202 and the index housing 208. The connectors 218, 220 may be configured to releaseably engage with one another. Preference may be given to devices that do not require tools or tooling, but this is not always necessary or desirable. When engaged, the fittings 218, 220 may create a flow path to permit flow of sample 170 into the index housing 208, where it may enter tubing 182 to direct the sample 170 to the inlet port 124 of the housing 118. An aperture 222 in the index housing 208 may provide appropriate exhaust via tubing 182.

Figure 11:
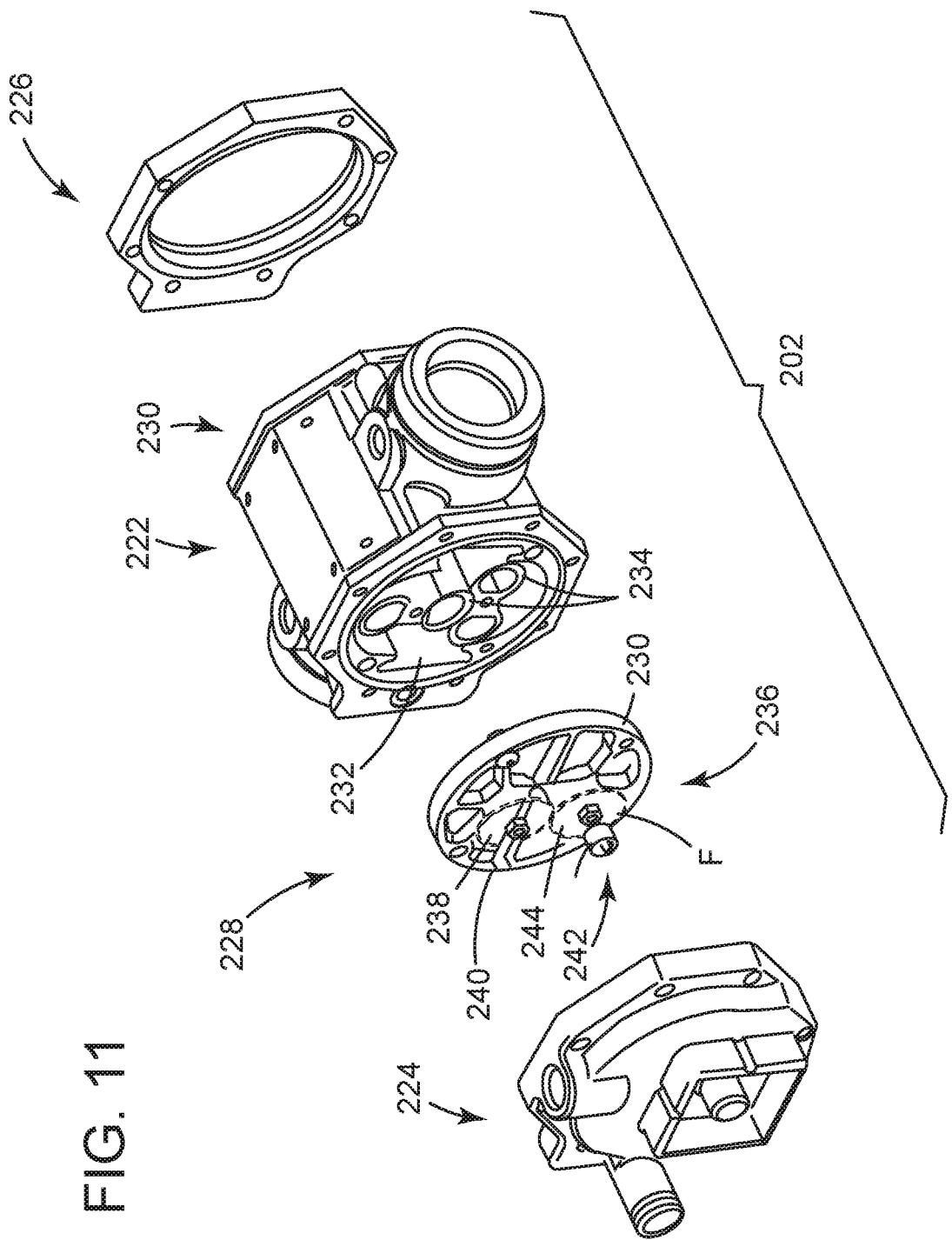
FIG. 11 depicts a perspective view of details of the structure of FIG. 8 in partially-exploded form.

FIG. 11 shows a perspective view of the front of the structure 200 in partially-exploded form. Components like the index unit 188 are removed from view to focus the discussion on the meter unit 186. In this regard, the meter body 202 may have a central cylinder 222 and with covers (e.g., a first cover 224 and a second cover 226). A mechanical assembly 228 may reside on the central cylinder 222. The assembly 228 may include cylinder end plates 230 that secure on opposite sides of the central cylinder 222. The end plates 230 enclose, provide bearing support, and form an inner cavity 232 with the central cylinder 222. Inside of the inner cavity 232, the central cylinder 222 houses impellers 234, which operate as the measurement device 191 for purposes of this example. On the front end, the assembly 228 may also include a timing gear assembly 236 having a pair of gears 238. The gears 238 can couple with the impellers 234, typically by way of one or more shafts that extend through the cylinder end plates 230 to engage with the impellers 234. A visual indicator 240 in the form of a bent, thin piece of metal can couple with one of the gears 238. The device may also include a non-contact sensor assembly 242 having a first sensor part 244 that couples with the other one of the gears 238. A second part of the assembly 242 may be found in the index unit 188 (not shown). In this way, both the first sensor part 244 and the visual indicator 240 will co-rotate with the gears 238 as the impellers 234 rotate in response to fluid that transits through the device via openings 204, 206.

In light of the foregoing discussion, the embodiments herein incorporate improvements that are useful to harvest or generate energy from combustible materials. These embodiments can capture energy from flowing fuel gas that transits through distribution lines to customers. The captured energy can supplement battery power that energizes electronics on a gas meter or other resident flow device. This feature is particularly beneficial to flow devices that reside in remote areas that lack a reliable (or any) source of electrical power.

This written description uses examples to disclose the invention, including the best mode, and also to enable any person skilled in the art to practice the invention, including making and using any devices or systems and performing any incorporated methods. An element or function recited in the singular and proceeded with the word "a" or "an" should be understood as not excluding plural said elements or functions, unless such exclusion is explicitly recited. References to "one embodiment" of the claimed invention should not be interpreted as excluding the existence of additional embodiments that also incorporate the recited features. Furthermore, the claims are but some examples that define the patentable scope of the invention. This scope may include and contemplate other examples that occur to those skilled in the art. Such other examples are intended to be within the scope of the claims if they have structural elements that do not differ from the literal language of the claims, or if they include equivalent structural elements with insubstantial differences from the literal language of the claims.

Examples follow below that include certain elements or clauses one or more of which may be combined with other elements and clauses describe embodiments contemplated within the scope and spirit of this disclosure.

What is claimed is:

1. A gas meter, comprising:
   a body forming an interior cavity and a pair of openings to permit fuel gas into the interior cavity;
   mechanical devices disposed in the interior cavity that move in response to flow of fuel gas between the openings; and
   a power generating device in flow connection with the interior cavity to draw a sample of fuel gas from the interior cavity, the power generating device configured to combust the sample of fuel gas and to generate an electrical signal in response to combustion of the sample.

2. The gas meter of claim 1, wherein the power generating device comprises a catalytic reactor that receives the sample of fuel gas.

3. The gas meter of claim 1, wherein the power generating device comprises a thermal electric generator that generates the electrical signal.

4. The gas meter of claim 1, wherein the power generating device comprises a heat sink having a temperature that is less than the temperature of combustion of the fuel gas.

5. The gas meter of claim 1, wherein the power generating device comprises an ignition assembly with an igniter and a battery coupled with the igniter.

6. The gas meter of claim 1, further comprising:
   a valve disposed in the flow of sample of fuel gas upstream of the power generating device.

7. The gas meter of claim 1, further comprising:
   an index housing coupled with the body,
   wherein the power generator resides in the index housing.

8. The gas meter of claim 1, wherein the mechanical devices comprise,
   a pair of impellers disposed in the interior cavity; and
   gears coupled with the pair of impellers so as to turn in concert with the pair of impellers in response to flow of material through the interior cavity.

9. A gas meter, comprising:
   a body forming a cavity, the body having openings with flanges to secure to a pipe;
   impellers disposed in the cavity that rotate in response to flow of material through the cavity; and
   a power generating device in flow connection with the cavity, the power generating device comprising,
      a catalytic reactor;
      a thermal electric generator; and
      a heat sink,
         wherein the thermal electric generator generates an electrical signal in response to a temperature differential that forms across the catalytic converter and the heat sink due to combustion of fuel gas.

10. The gas meter of claim 9, wherein the power generating device comprises a housing enclosing each of the catalytic reactor, the thermal electric generator, and the heat sink.

11. The gas meter of claim 9, wherein the power generating device comprises control structure to regulate flow of fuel gas to the catalytic reactor.

12. The gas meter of claim 11, wherein the control structure comprises a temperature sensor.

13. The gas meter of claim 11, wherein the control structure comprises a valve disposed in the flow of fuel gas upstream of the catalytic converter.

14. The gas meter of claim 9, wherein the power generating device comprises driver circuitry that receives the electrical signal from the thermal electric generator.

15. A method, comprising:
    using a gas meter for,
       measuring volumetric flow of fuel gas; and
       concurrently generating power from the flow of fuel gas by,
          generating heat from a sample of the flow of fuel gas;
          using the heat, creating a temperature differential; and
          generating an electrical signal in response to the temperature differential.

16. The method of claim 15, further comprising:
    causing the flow of fuel gas to impinge on a pair of impellers, wherein rotation of the impellers corresponds with volumetric flow.

17. The method of claim 16, further comprising:
    creating the sample from a location proximate the pair of impellers.

18. The method of claim 16, further comprising:
    flowing the sample from a first cavity that houses the pair of impellers to a second cavity that houses electronics on the gas meter.

19. The method of claim 18, further comprising:
    directing the sample to a catalytic reactor disposed in the second cavity, wherein the heat originates from the catalytic reactor.

20. The method of claim 18, further comprising:
    activating a thermal electric generator disposed in the second cavity in response to the temperature differential, wherein the electrical signal originates from the thermal electric generator.

* * * * *